(12) United States Patent
Bowman et al.

(10) Patent No.: US 10,455,082 B2
(45) Date of Patent: Oct. 22, 2019

(54) COPPER IMPAIRMENT TESTING AND REMEDIATION IN DIGITAL SUBSCRIBER LINE (DSL) SERVICE

(71) Applicant: VIAVI SOLUTIONS INC., San Jose, CA (US)

(72) Inventors: Brian Bowman, Germantown, MD (US); Reynald Dupuis, Germantown, MD (US); Paul Snead, Germantown, MD (US)

(73) Assignee: VIAVI SOLUTIONS INC., San Jose, CA (US)

(*) Notice: Subject to any disclaimer, the term of this patent is extended or adjusted under 35 U.S.C. 154(b) by 0 days.

(21) Appl. No.: 16/050,946

(22) Filed: Jul. 31, 2018

(65) Prior Publication Data
US 2019/0245966 A1 Aug. 8, 2019

Related U.S. Application Data

(60) Provisional application No. 62/628,091, filed on Feb. 8, 2018.

(51) Int. Cl.
| H04M 3/30 | (2006.01) |
| H04B 3/46 | (2015.01) |
| G01R 31/08 | (2006.01) |
| H04L 12/24 | (2006.01) |
| G01R 31/02 | (2006.01) |

(52) U.S. Cl.
CPC .......... *H04M 3/306* (2013.01); *G01R 31/025* (2013.01); *G01R 31/08* (2013.01); *H04B 3/46* (2013.01); *H04L 41/0631* (2013.01); *H04L 41/0654* (2013.01); *H04L 41/22* (2013.01)

(58) Field of Classification Search
CPC ....... H04M 3/30; H04M 11/062; H04L 43/50; H04Q 11/045; H04Q 2213/13039; H04Q 2213/13166; H04Q 2213/13209
USPC .................. 379/1.03, 21, 9.06, 22.02, 22.03; 370/241, 250
See application file for complete search history.

(56) References Cited

U.S. PATENT DOCUMENTS

| 8,588,705 | B1 * | 11/2013 | Tsui ...................... H04W 52/24 455/69 |
| 2004/0086086 | A1 * | 5/2004 | Butler ...................... H04M 1/24 379/9 |
| 2005/0249332 | A1 * | 11/2005 | Chang ...................... H04L 43/50 379/22 |
| 2006/0072708 | A1 * | 4/2006 | Warner ................ H04Q 11/045 379/1.03 |

* cited by examiner

*Primary Examiner* — Melur Ramakrishnaiah
(74) *Attorney, Agent, or Firm* — Mannava & Kang, P.C.

(57) ABSTRACT

A test instrument connectable to a network to provide copper impairment testing and remediation in a digital subscriber line (DSL) service is provided. The test instrument may comprise a port connectable to a test point in a network. The test instrument may also comprise a processing circuit to perform tests in the following categories: (i) shorts, grounds, and opens, (ii) true length, (iii) balance, and (iv) series fault, wherein the combination of these tests may determine copper impairment. Once tests are conducted, one or more remediation recommendations may be provided based at least in part on failure in one of the test categories. The test results and remediation recommendations may then be presented at an output, such as a display at a test instrument or user device.

20 Claims, 17 Drawing Sheets

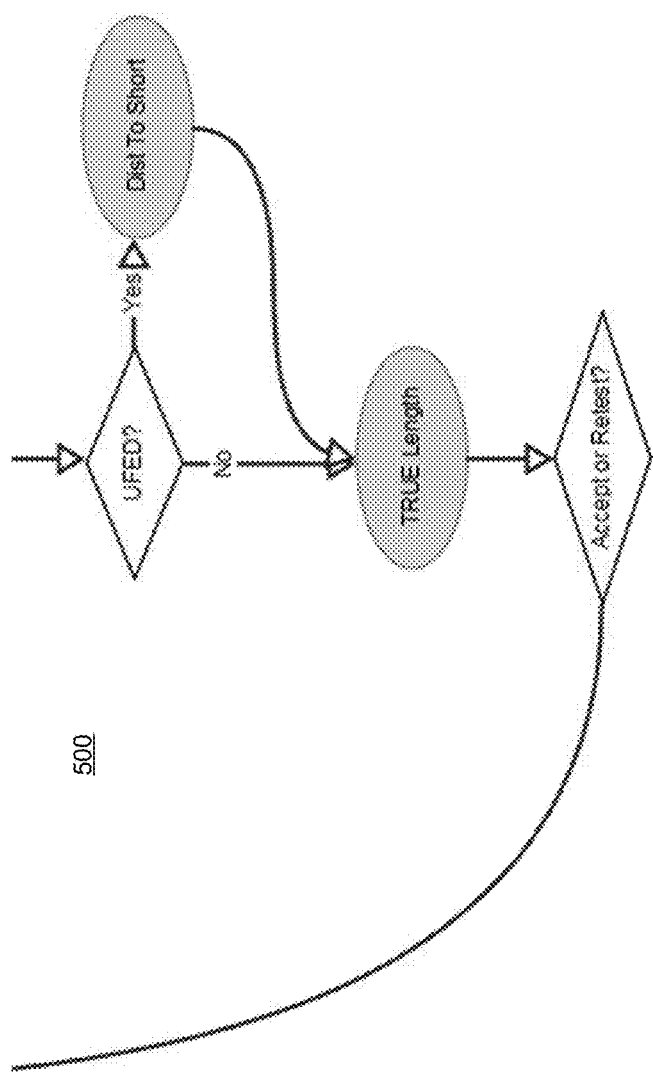

COPPER IMPAIRMENT TESTING AND REMEDIATION IN DIGITAL SUBSCRIBER LINE (DSL) SERVICE

PRIORITY

This patent application claims priority to U.S. Provisional Patent Application 62/628,091, entitled "Copper Impairment Testing and Remediation in Digital Subscriber Line (DSL) Service," filed on Feb. 8, 2018.

BACKGROUND

Digital subscriber line (DSL) technology allows digital data to be transmitted over telephone lines. DSL service can be delivered simultaneously with wired telephone service on the same telephone line (e.g., over standard copper pair facilities) since DSL typically uses higher frequency bands for data transmission. Although it is becoming increasingly popular to transmit data using high-bandwidth fiber-optic cable, installation of these fiber-optic cables is extremely cumbersome and expensive. Because DSL service may be employed over existing copper-based cables, DSL is still widely used and advancements in DSL technologies continue to persist. However, testing copper-based cables remains a challenge.

Technicians are not typically able to identify and repair copper-related impairments on their own, and often rely on a copper expert. This process is often drawn-out and inefficient. For example, an inexperienced technician will call a copper expert as soon as he or she is unable to find a fix, even without being entirely sure a copper pair is faulty, extending repair times and increasing usage of resources. Furthermore, current methods do not look at a cable pair under test to determine what the overall condition of the pair is nor do they provide recommendations to remedy the problem or provide a fix.

BRIEF DESCRIPTION OF THE DRAWINGS

Features of the present disclosure are illustrated by way of example and not limited in the following Figure(s), in which like numerals indicate like elements, in which:

FIGS. 5A-5B illustrates a flow for providing true length testing, according to an example;

DETAILED DESCRIPTION

Figure 1:
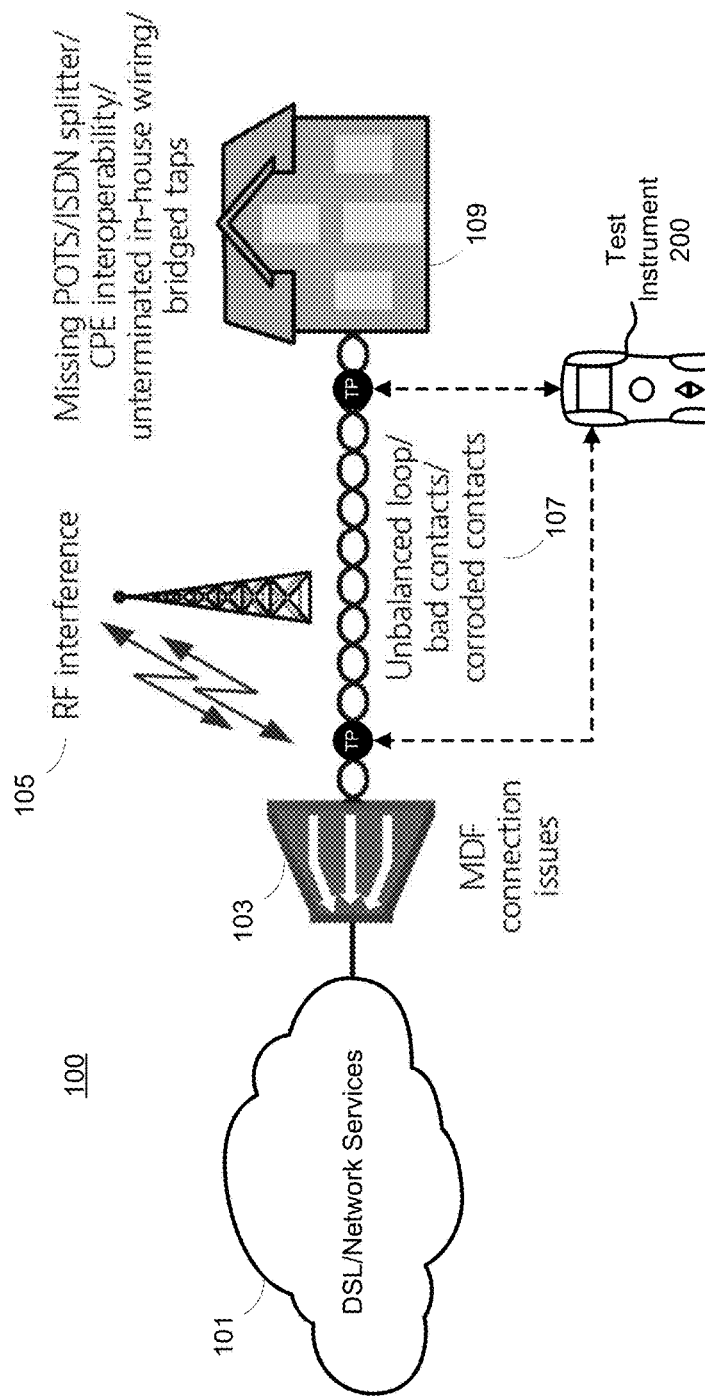
FIG. 1 illustrates a system diagram for DSL-related problems in a network, according to an example.

For simplicity and illustrative purposes, the present disclosure is described by referring mainly to examples and embodiments thereof. In the following description, numerous specific details are set forth in order to provide a thorough understanding of the present disclosure. It will be readily apparent, however, that the present disclosure may be practiced without limitation to these specific details. In other instances, some methods and structures readily understood by one of ordinary skill in the art have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

Because DSL services may be employed over existing copper-based cables, DSL is still widely used for transmission of data. Most homes and businesses that use DSL service may be connected to an asymmetric DSL (ADSL) line. ADSL divides up available frequencies in a line on the assumption that most users look at (or download) much more data than they send (or upload). ADSL service may then be primed to provide more download capability based on this assumption.

Precisely how much benefit a user may get from ADSL may depend on how far the user (or user's equipment) is from the central office of the company providing the ADSL service (or service provider). ADSL is a distance-sensitive technology. In other words, as the connection length increases, signal quality decreases and connection speed goes down. A typical limit for ADSL service may be 18,000 feet (5,460 meters).

Advancements and variations in DSL technologies have sought to address some of these distance or quality-related problems. For example, very high bit-rate DSL (VDSL) may be a very fast connection; but may work over shorter distances. VDSL may be capable of handling Internet access, high-definition television (HDTV), and on-demand services at rates of 52 Mbps downstream and 12 Mbps upstream. Symmetric DSL (SDSL) may be typically used by small businesses. Although SDSL may not allow simultaneous phone usage, there may be more available frequency (and therefore speed) for receiving and sending data. Rate-adaptive DSL (RADSL) may be considered a variation of ADSL, in which a modem may adjust a speed of the connection depending on length and quality of the line, Integrated Services Digital Network (ISDN) DSL (IDSL) may be used as well. IDSL may be combination of the ISDN and DSL technology. IDSL may be faster than ISDN connections but slower than DSL. However, IDSL service may travel a longer distance, e.g., 5 to 6 miles, so it may be a better option for customers who are unable to get DSL in their area. Universal DLS (Uni-DSL) may offer backwards compatibility with existing versions of DSL. Uni-DSL may provide somewhat of a middle ground between ASDL and VDSL. For example; at longer distances, it may reach the speeds of ASDL, but it may provide greater speeds than VDSL at shorter distances, in some locations; Uni-DSL may provide four times the amount of speed as VDSL.

Because of existing infrastructure and cost, DSL and all its related technologies remains a popular low-cost option for data services. An important part of DSL services may include properly testing and maintaining copper. What may have worked for plain old telephone service (POTS) or lower-speed DSL may no longer work for VDSL, for degrading plants, or other new DSL technologies. As shown in Table 1 below, several copper-related tests may be shown, including what each test does and its importance to DSL.

TABLE 1

TYPES OF COPPER TESTS

| Copper Tests | What It Tests | Why It Is Needed |
| --- | --- | --- |
| Voltage | Foreign voltages | Safety and identifies cross-battery impairments |
| Resistance | Insulation between tip-A and ring-B and between tip-A, ring-B, and ground-E | Leakage resistance affects DSL sync and performance |
| Opens (capacitance) | Loop length and capacitive balance | Cable damage, one side open, loop length must be acceptable for DSL |
| Balance | Longitudinal balance, resistive balance, capacitive balance | Robustness against noise, otherwise reduced BPT |
| Load coil | Presence of load coils | Load coils act as low-pass filters and must be removed for DSL to work properly |
| Ground check | Ground connection check for balance | Poor or lack of ground leads to incorrect results, hides possible impairments |

Testing copper-based cables may be an important part of DSL provisioning and servicing. However, adequate testing and repeatability still remain challenging. Furthermore, as described above, technicians may not typically be able to identify and repair copper-related impairments on their own, and may often rely on a copper expert. For example, an inexperienced technician may call a copper expert as soon as he or she encounters a potential copper-related problem he or she is unable to find a fix. Reaching out to a copper expert may be done even without being sure the copper is faulty, extending repair times and overloading usage of resources. In addition, current methods do not look at a cable pair under test to determine what the overall condition of the pair is nor do they provide recommendations on all the steps to remedy the problem.

Copper impairment testing and remediation, as described herein, may provide an approach to look at the cable pair under test and determine what the overall condition of the pair is ("status") and provide some remediation suggestions or recommendations ("advice") on what to do next or have the next step be to just do it and keep going until the problem(s) are identified, found, and fixed. Copper impairment testing and remediation, as described herein, may be used for prequalification, but its main focus may be cable repair because of the time required to fully analyze a copper pairs issues.

FIG. 1 illustrates a system diagram for DSL-related problems in a network, according to an example. In FIG. 1, DSL service may be limited by various issues. Among these, copper-loop issues such as foreign voltage, opens shorts, and load coils may impact DSL services and overall DSL performance.

Copper impairment testing and remediation, as described herein, may provide a series of copper tests performed on a cable pair. A summary of results may be displayed on a test instrument in a format which is easy to read and allow a user to quickly determine the outcome of these copper tests. Detailed results may also be available as well as advise a technician on how to proceed. As a result, more than just a series of tests, copper impairment testing and remediation, as described herein, may also provide a comprehensive and robust approach to testing and remediation of copper-based services.

In one example, the first set of tests performed may be basic copper tests, including:

DC volts T/G, R/G, and T/R;
AC volts T/G, R/G, and T/R;
Opens (capacitance) T/G, R/G, and T/R with capacitive balance;
Circuit resistance (pair open) T/G, R/G, and T/R;
Loop resistance (pair shorted);
Resistive balance (pair shorted to ground);
Longitudinal Balance; and
Wideband noise.

Figure 2:
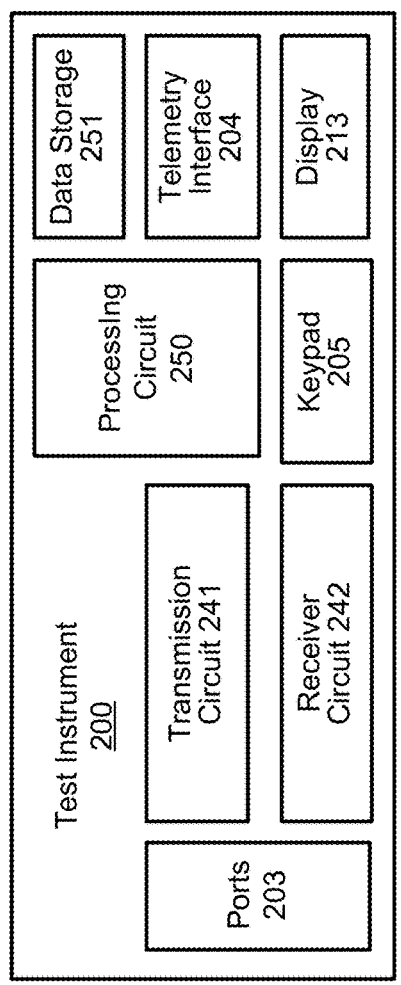
FIG. 2 illustrates a test instrument 200 for copper impairment testing and remediation, according to an example.

FIG. 2 illustrates a test instrument 200 for copper impairment testing and remediation, according to an example. The test instrument 200 for copper impairment testing and remediation may include a variety of components. The test instrument may be connected to a network (e.g., a DSL network or service) at any desired test point (TP) to measure signals transmitted in the network. The test instrument 200 may include one or more ports 203 to connect to the test point (TP). In an example, the ports 203 may include coaxial RF cable connectors, as well as other non-cable ports, for example, to connect to a computer or to an external display, such as, but not exclusively, one or more USB ports, telephone, and the like.

The test instrument 200 may also include a telemetry interface 204 for connecting to a telemetry channel, such as a WiFi interface, Bluetooth interface, cellular interface or another network interface. The test instrument 200 may also connect to a remote device via the telemetry interface 204.

It should be appreciated that the test instrument 200 for copper impairment testing and remediation may include a user interface which may include a keypad 205 and display 213. The display 213 may include a touch screen display. A user may interact with the test instrument 200 via the user interface to enter information, select operations, view measurements, examine signal profiles, communicate with other devices, etc.

A data storage 251 may also be found in the test instrument 200. The data storage 251 may store any information used by the test instrument 200 and may include memory or another type of known data storage device. The data storage 251 may store data, power level measurements and/or any other measurements or data used by the test instrument. The data storage 251 may include a non-transitory computer readable medium storing machine-readable instructions executable by processing circuit to perform operations of the test instrument 200.

A transmission circuit 241 may include a circuit for sending test signals into the network to perform various tests. The transmission circuit 241 may include encoders, modulators, and other known component for transmitting signals in the network. A receiver circuit 242 may include components for receiving signals from the network. The transmission circuit 241 and/or the receiver circuit 242 may also include other components, such as a demodulator, a decoder, an ADC, and/or other circuit components or elements.

A processing circuit 250 in the test instrument 200 may include any suitable hardware to perform the operations of the test instrument 200 described herein. The hardware of the test instrument 200, including the processing circuit 250, may include a hardware processor, microcontroller, a digital signal processor (DSP), an application specific integrated circuit (ASIC), a field programmable gate array (FPGA) or other programmable logic device, discrete gate or transistor logic, discrete hardware components, or any combination thereof designed to perform the functions and methods described herein. In an example, one or more of the functions and operations of the test instrument described herein may be performed by the processing circuit or other hardware executing machine readable instructions stored in a non-transitory computer readable medium, which may comprise RAM (random access memory), ROM (read only memory), EPROM (erasable, programmable ROM), EEPROM (electrically erasable, programmable ROM), hard drives, flash memory, or other types of storage devices, which may be volatile and/or nonvolatile. It should be appreciated that the test instrument 200 may include components other than what is shown.

The test instrument 200, among other things, may be used for copper impairment testing and remediation, but also a variety of other measurements, such as voltage, shorts, grounds, resistance, length, measure bit error rate (BER), service disruption time (SDT), and various stress-test device under tests (DUTs) to verify performance under severe conditions. This may increase testing efficiencies and minimize expense. Other various tests may also be performed.

Figure 3A:
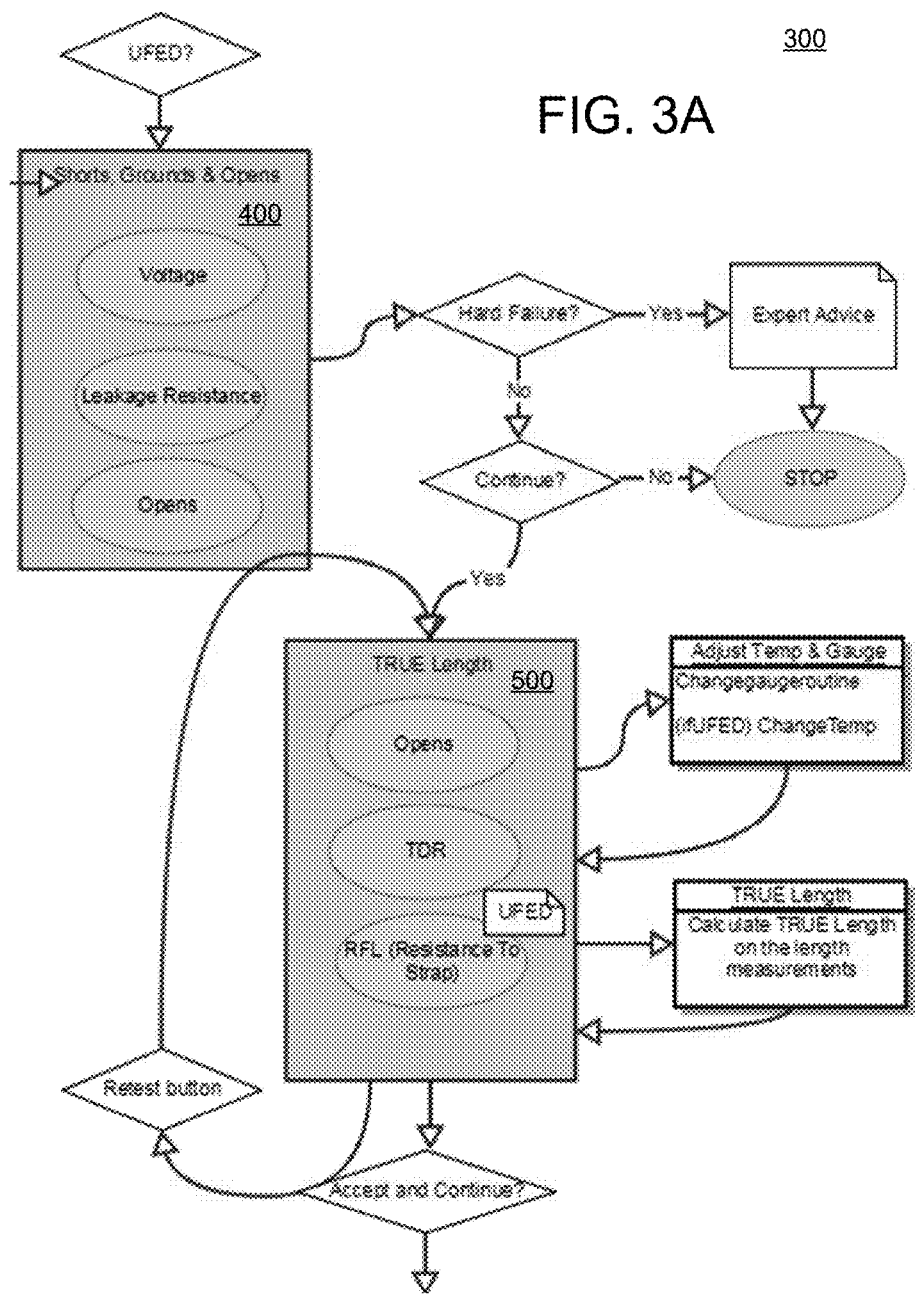
FIGS. 3A-3B illustrates a flow for copper testing and remediation in a DSL network, according to an example.
Figure 3B:
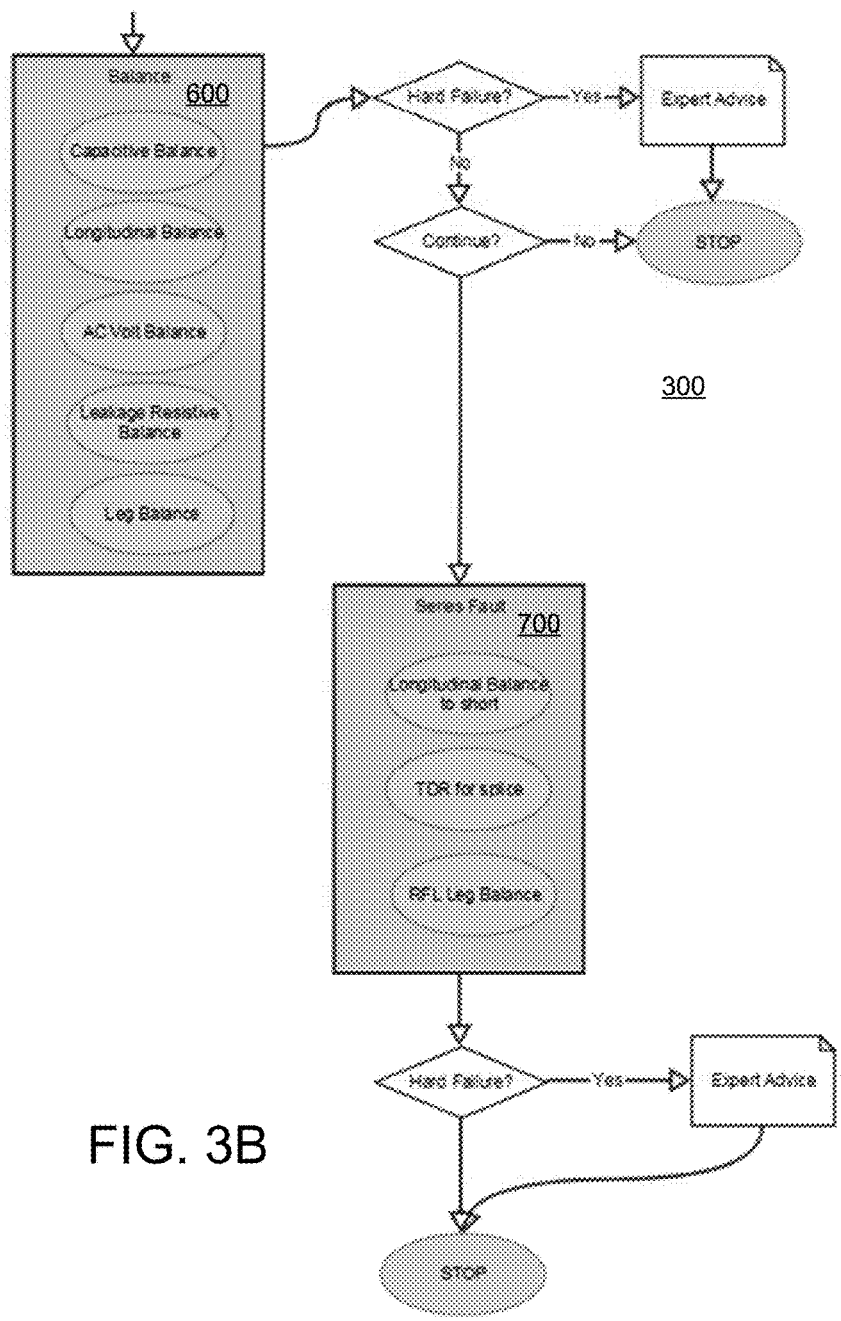

FIGS. 3A-3B illustrates a flow 300 for copper testing and remediation in a DSL network, according to an example. Copper testing and remediation may include at least four sections of testing. The first test may include detecting shorts, grounds, and/or opens 400. This test may use voltage and resistance, e.g., to look for high voltage. If a ground is detected, for example, the test may then run a resistive fault locate (RFL) pre-qualification routine. The RFL may then be run if conditions are met.

The second test may be a true length test 500. This test may use opens, time domain reflectometry (TDR), and RFL to measure the different lengths. RFL may require a ULTRA Far End Device (UFED), described in more detail below. True length may be a calculation from the given measurements. If a TDR test, for example, detect a bridge tap, the length of the tap may be removed from opens length. The test may also require a user to enter the temperature and gauge.

As shown in FIG. 3B, where flow 300 continues, the third test may include pair balance 600, which may involve a variety of sub-tests, such as capacitive balance, longitudinal balance, AC voltage balance, resistive leg balance, and/or leakage resistance balance. RFL leg balance may also require a UFED.

The fourth test may be a series fault test 700. This test may include longitudinal balance to short and open, RFL leg balance, and/or TDR for splice detection. More detail on each of these tests for copper testing and remediation in a DSL network will be provided in more detail below.

Before turning to each of these tests, it should be appreciated that at each test, if a hard failure is determined, expert "advice" or remediation recommendation may be provided. Other various tests, remediation, or offerings may also be provided. It should also be appreciated that several parameters and criteria may be used. As described herein, there may be several functional parameters used to achieve a level of accuracy and reliability in testing and remediation results. It should be appreciated that these values and parameters are exemplary.

Figure 4:
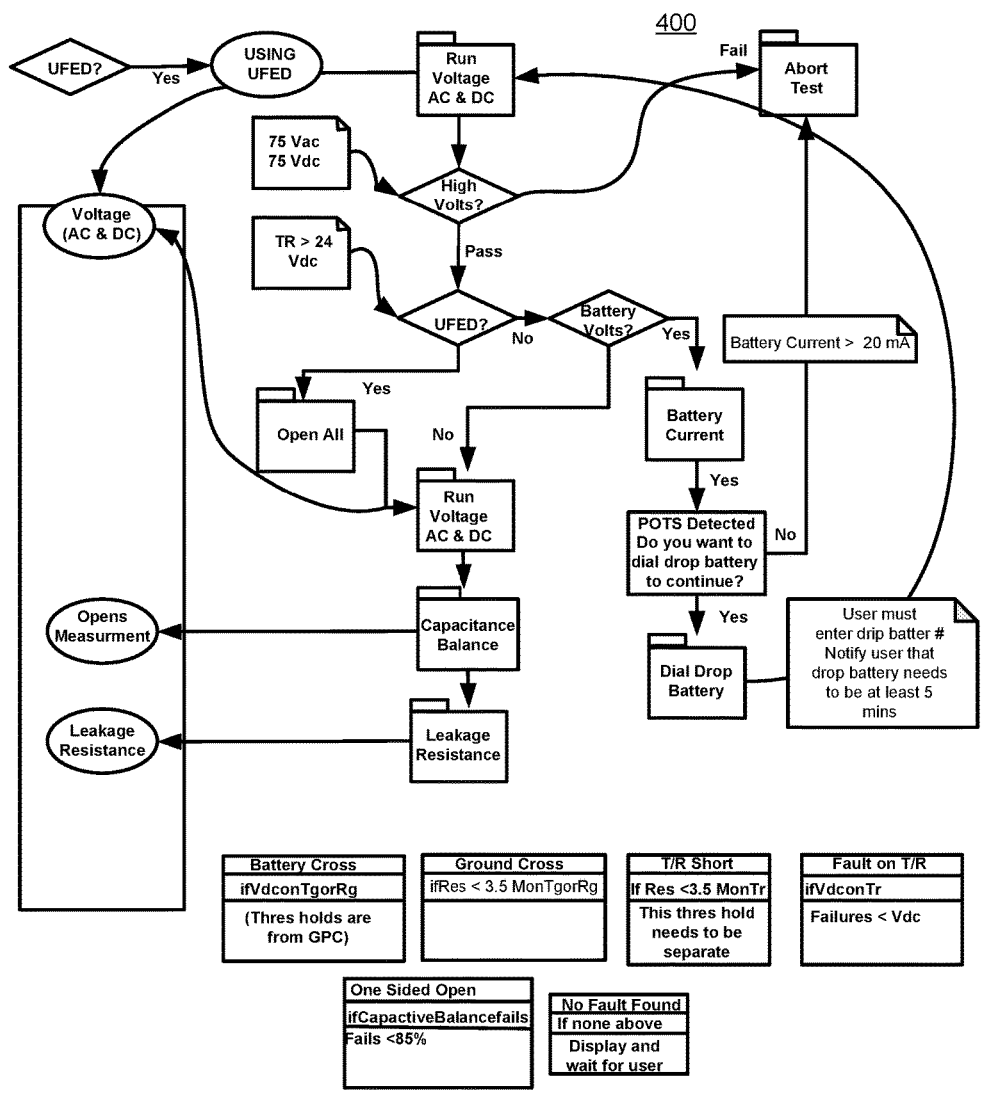
FIG. 4 illustrates a flow for providing voltage and resistance testing in a DSL network, according to an example.

FIG. 4 illustrates a flow 400 for providing voltage and resistance testing in a DSL network, according to an example. Voltage and resistance testing may be used to determine if there is or possibly is high voltage (dangerous), short, ground, or opens on DSL line under test. A few scenarios may be provided for the voltage and resistance testing, including validating a copper pair with UFED termination or validating a copper pair without UFED termination. Other scenarios may also be provided. It should also be appreciated that function parameters and setup for this category of tests may be similar to those described above and with respect to FIGS. 3A-3B.

Voltage (AC or DC) may be the initial test for this test category. In particular, the test may be aimed at determining high voltage. If high voltage is detected, then a user may be alerted and may not continue until the voltage is removed. If there is a UFED, then this test may be performed in the open all state.

Other subsequent tests may also be performed within this category. Capacitance balance may also be tested. The capacitance measurement may be performed to get a balance. Leakage resistance may be tested. An ohms measurement may be performed. When using an ACT1, the leakage 115V mode may be used. When using an ACT2, the leakage 115V 3 terminal mode may be used. If there is a UFED, then this test may be performed in the open all state. Below are potential threshold parameters and values.

| | Thresholds | |
| --- | --- | --- |
| Test | Pass | Fail |
| High Voltage AC | ≤75 Vac | >75 Vac |
| High Voltage DC | ≤75 Vdc | >75 Vdc |
| Battery cross | ≤2.0 Vdc | >2.0 Vdc |
| Battery fault | ≤2.0 Vdc | >2.0 Vdc |
| Short on loop | ≥3.5 MΩ | <3.5 MΩ |
| Ground on leg | ≥3.5 MΩ | <3.5 MΩ |
| One Sided Open | ≥85% | <85% |

There may be several types of messages or alerts provided in the voltage and resistance testing category. For example, high voltage on T/R may give a dialog and audio alert and the user may have to abort the test.

For UFED, if the user selects that they are using a UFED and there is no a response from the UFED, there may be a message telling the user to ensure the leads are connected. They may also be given an option to Stop, Retry or Continue without UFED. The Stop and Retry may perform as expected. The Continue without UFED may perform the test as if there is no UFED. This may to allow the user, for example, to test opens.

For plain old telephone service (POTS) battery, if there is >24 Vdc on T/R, then a current measurement may be measured. If there is more than 20 mA for DC current on T/R, then this line has POTS battery. The user may be informed and asked for a drop battery phone number. This number may be dialed so testing can be performed without a battery. The testing may be restarted after dialing the drop battery. The user may also have an option to not dial a drop battery but that aborts the test.

There may be a number of reported results associate with the voltage and resistance testing. One, for example, is a battery cross. Here, if there is no battery cross, then the line may have a pass icon and display, "No battery crosses >2.0 Vdc." Battery cross on both legs may have a fail icon and display, "Battery contact Tip & Ring." This may also be internationalized with A & B. Battery cross on a leg may have a fail icon and display, "Battery cross on Tip." The proper leg may be displayed and internationalized with A/B. Battery cross on both legs may have a fail icon and display, "Battery contact Tip & Ring." This may be internationalized with A & B.

Battery fault may be another potential result from testing. Battery fault on T/R may have a fail icon and display "Fault on A/B." This may be internationalized with A/B. It should be appreciated that no messages may be displayed if there is no battery fault.

In situations with a shorts or grounds, a short on loop may have a failed icon and display "Tip/Ring short." This may be internationalized with A/B. Ground on both legs may have a fail icon and display "Ground cross on Tip & Ring." This may be internationalized with A & B. Ground on a leg may have a fail icon and display "Ground cross on Tip." The proper leg may be displayed and internationalized with A/B. If no ground fault, there may be a pass icon and may display "No resistive fault <3.5 MΩ." In a one-sided open scenario, a capacitive balance failure may have "One Sided Open" with a failure icon.

As described herein, the testing and remediation at each stage may provide remediation recommendations or "expert advice." In the voltage and resistance test categories, there may be several potential options. If cap balance fails, then the expert advice may report "Possible one side open on (Tip/Ring/A/B) at XX ft/m" where XX is the distance measured in the 2-terminal opens. If voltage test indicates any battery cross, then the expert advice may report "Check Ground(s) & Retest." If leakage test indicates the loop is too short, then expert advice may report "Run Auto ID TDR or RFL." If leakage balance does not pass (fail or marginal): (1) If RFL was able to locate the fault and size, report "Fault located XX (unit) with the size YY Ω," where XX is the distance and (unit) is the units of ft or m and YY is the ohms size; (2) If it qualifies for a single RFL, then report "Single Pair RFL eligible\nRun RFL to locate and fix fault;" (3) If it qualifies for K type RFL, then report "Separate Pair RFL eligible\nRun RFL to locate and fix fault;" and (4) if there is no fault then report "No T/R fault." This may be internationalized with A/B.

Figure 5A:
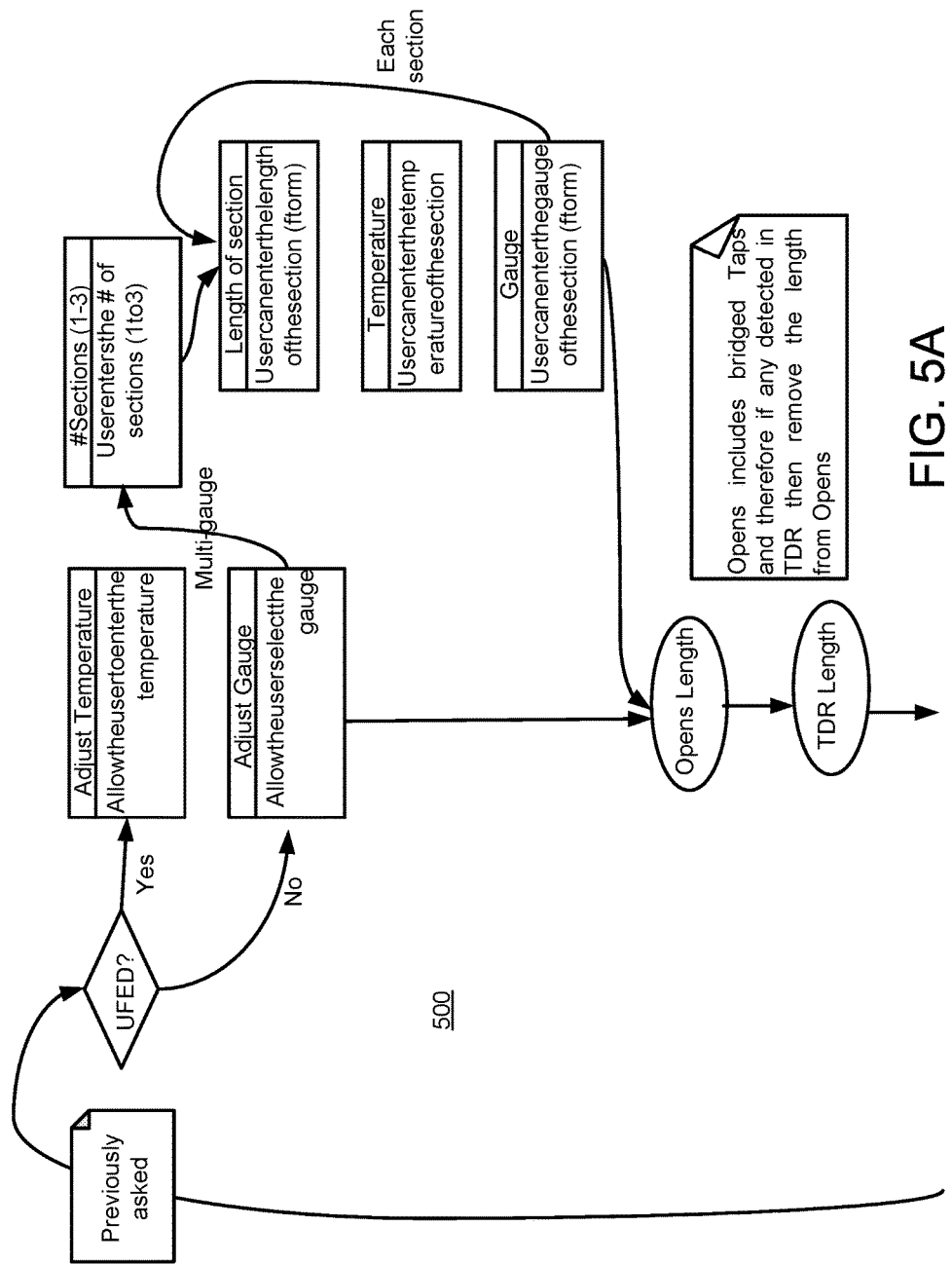

FIGS. 5A-5B illustrates a flow 500 for providing true length testing, according to an example. True length testing may include finding a length of the copper line. Length may be determined with opens, TDR, and/or resistance to strap. Opens may be accurate if there are no bridge taps. TDR may be accurate if the right settings are applied. It also may detect a bridge tap and if it does, then the length of the bridge tap may be removed for the length of the open. Resistance to strap may be accurate with right temperature and more importantly the right gauge setting. Given these results, there may be a true length calculated given the results are within certain tolerances.

It should be appreciated that some functional parameters may be used for an exemplary scenario, as shown below.

| Setups | | | |
|---|---|---|---|
| Setup Name | Default Value | Units | Notes |
| Opens | | | |
| Conversion for Loop | 52.0 | nF/Km | For BT only |
| Conversion for Ground | 48.0 | nF/Km | For BT only |
| Conversion for Loop | 83.0 | nF/Km | |
| Conversion for Ground | 134.8 | nF/Km | |
| TDR | | | |
| Propagation Velocity | 0.667 | | |
| TVG Adjust | Per gauge selection | | |
| Audio alert | True | | |
| Mode | Auto ID | | |
| User Selection | | | |
| Temperature | 72° F. or 20° C. | | International setting |
| Gauge list for Imperial | 19 AWG | | |
| | 22 AWG | | |
| | 24 AWG | | |
| | 26 AWG | | |

| Setups (continued) | | | |
|---|---|---|---|
| Setup Name | Default Value | Units | Notes |
| Gauge list for Metric | PE 0.4 | | |
| | PE 0.5 | | |
| | PE 0.6 | | |
| | PE 0.8 | | |
| | PVC | | |
| Multiple gauge | selection is available when using UFED and allows user to select up to 3 sections. They have to enter a length, temperature and gauge for each section | | |

True length testing category may provide several measurements. For example, opens length is one, which may be length from the capacitance on T/R given the cable type and gauge. If the TDR detects a bridge tap, then the length of the bridge tap may be removed from the opens length. If there is a UFED then this test may be performed in the open all state. For TDR length, Auto ID TDR may be run to find the end of line (EOL). If there is no EOF detected, then the length may not be shown or used in the true Length calculation. If there is a UFED then this test may be performed in the open all state. For distance to short, this test may be performed if there is a UFED and the state of the UFED is a strap to all. The test may be a resistance (ohms) measurement across T/R and then a calculation for the length may be performed. This calculation may depend on the temperature and the cable type & gauge.

It should be appreciated that, as used herein, UFED may refer to a ULTRA Far End Device, A UFED may be a hand-held device with optional desktop software, data cables, adapters and other peripherals, and may having all the hardware and processing capabilities of test instrument 200, as described herein. Although examples described herein refer to UFED, it should be appreciated that other devices may be used as well, such as Far End Device (FED) or other similar device for testing purposes.

Multiple gauge calculation may also be provided. For example, the distance to short length calculation may be performed differently when the user selects multiple gauge. A summary of the calculation may be provided, as follows:
1. Given the user's input of the temperature, gauge and length for each section, a resistance for each section is calculated. Important to note this is the calculated resistance (not measured)
2. Calculated the percent of the calculated resistance for each section to the whole calculated resistance
3. Measure overall resistance
4. Use the sections percent of the calculated resistance multiplied to the measured to get that sections resistance
5. Calculated it sections length given the temperature, gauge and resistance from step #4
6. Add all the sections length for a total distance to short length Various user interactions may be provided as well. For cable type and gauge, a user may be allowed to change the cable type and gauge. The selections for the gauge may be either the US list for countries that are imperial or the UK list. This may determine the capacitance value (nF or uF) per distance and the ohms per distance at 20° C. These may be used when calculating the distance in Opens and RTS.

For temperature, a user may be allowed to change the temperature setting in ° F. or ° C. depending on their international setting.

In summary, there may be two steps in true length testing, as described below. In Step 1:
If there is a valid opens and TDR length, then compare those two.
If they are within 10%+10 ft, then average the two lengths for the original true length.
If they are not within 10%+10 ft, then weight the opens length with a 2:1 to the TDR length.

Figure 6:
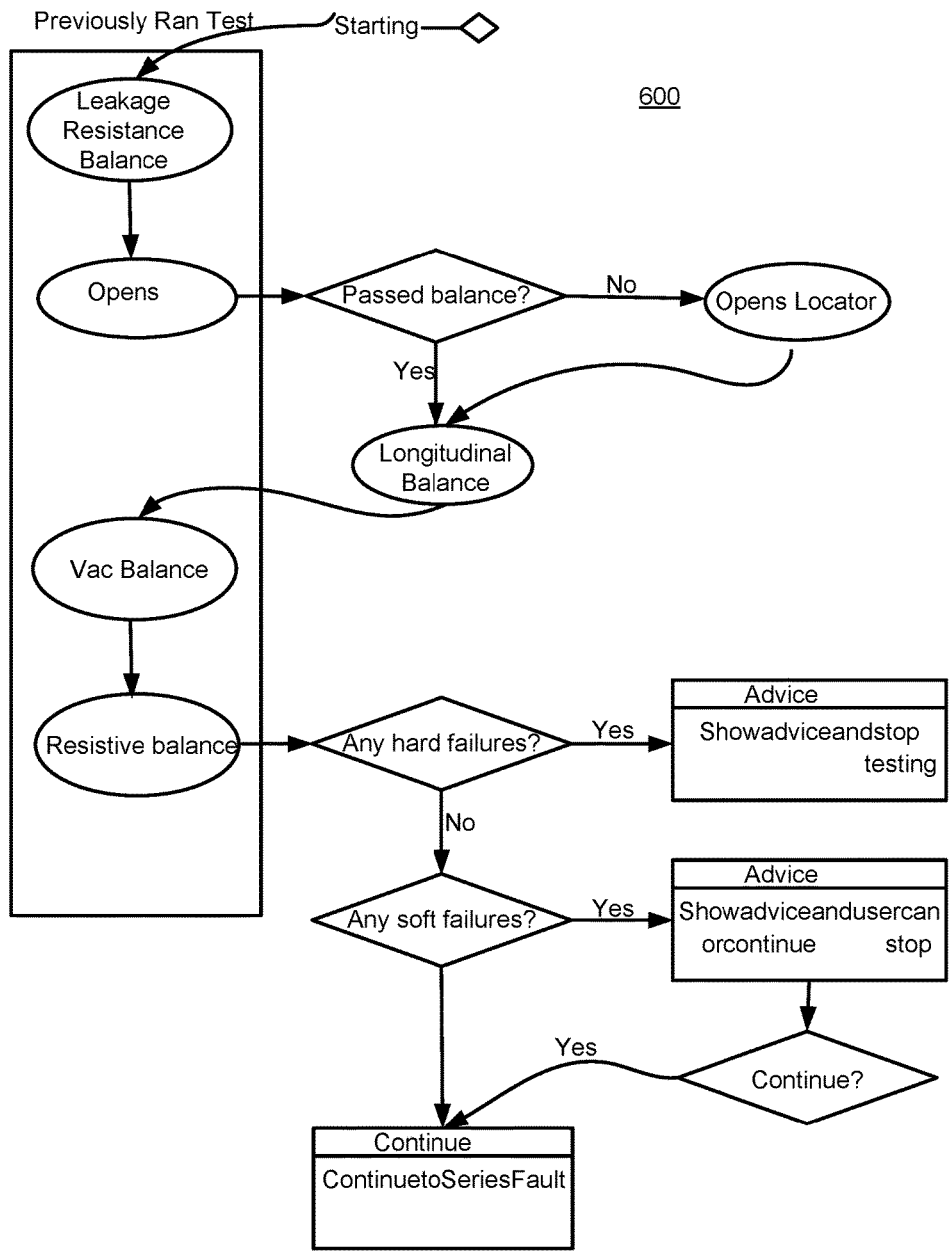
FIG. 6 illustrates a flow for balance testing in a DSL network, according to an example.

In Step 2:
Compare Opens to TDR with a 2% tolerance, Opens to RTS with a 2% tolerance and compare TDR to RTS with 2% tolerance.
If all three comparisons are within 2% then evenly average for the true length
If two of the three comparisons are within 2% then evenly average for the true length
If only one of the comparisons are within 2% then use only those two values and average for the true length FIG. 6 illustrates a flow 600 for balance testing in a DSL network, according to an example. Balance testing may include capacitive balance, longitudinal balance, resistive leg balance, leakage resistance balance, or others.

In capacitive balance, the opens test may get the capacitive values for tip and ring. This may be using 3-terminal settings. A balance result may be one of the methods described below:
1. Balance by percent
   1. This may be performed if T/R value is ≥100 nF or T/R value ≥50 nF and the difference in Tg and Rg is ≥7.5 nF
   2. The result may be the smaller leg value divided by the larger leg value.
   3. Example: Tg=600 nF and Rg=650 nF→600 nF/650 nF=0.923=92.3%
   4. Threshold may be ≥97% is a pass and <85% is fail
2. Balance by nF
   1. This may be performed when the criteria for % isn't met
   2. The result may be the absolute value in the difference of the legs in nF.
   3. Example: Tg=600 nF and Rg=650 nF→|600 nF−650 nF|=50 nF
   4. Threshold may be ≤3.0 nF is a pass and >7.5 nF is a fail If the capacitive balance fails, then there may be a possible open. The opens test may run again using 2-terminal mode on just Tg and Rg to get an accurate distance for the open using the cable type already set by the user in the length section.

For longitudinal balance, this test may be performed to an open. There may be lower and upper thresholds set for this test. In order to pass, the result may need to be ≥60 dB and ≤98 dB.

In AC voltage balance, the AC Voltage may have previously been run at the beginning of copper testing (e.g., in voltage and resistance testing). The result for this test may be an absolute difference of the Tg and Rg AC voltage. This test passes if the difference may be ≤0.5 Vac.

For resistive leg balance, this test may be performed if there is a UFED and the UFED is in the strap all state. Most likely, this test may have been previously run and the results will be used from an earlier true Length test. Here, this test may use RFL test to determine the resistance for Tg and Rg. The balance result may be calculated if both Tg and Rg resistances are valid. Additional steps in determining the balance result may include the following:
1. Find the percentage result. This may be the smaller of the leg resistances divided by the larger of the leg resistance and multiplied by 100 for percent
   1. Example: Tg=600Ω and Rg=650Ω→600Ω/650Ω=0.923=92.3%
   2. The percentage result may pass if the result is ≥98% and fails if it is <90%
2. If the percentage result fails (<90%), then there may be an ohm balance result. The ohm balance result may be calculated by the absolute value of the difference in ohms between Tg and Rg
   1. Example: Tg=600Ω and Rg=650Ω→|600Ω−650Ω|=50Ω
   2. The ohm balance may pass if ≤2.0Ω and fails if >5.0Ω

If the balance fails, then the RFL locator may be run, if possible. The criteria for running the RFL may be if Tg or Rg<20 MΩ and the ratio between Tg and Rg is a 500:1 or higher For leakage resistance balance, the leakage resistance test may have also been previously run at using a prior test. This test may pass if both legs have a resistance >10 MΩ. If not, the balance result may be calculated by dividing the smaller leg resistance by the larger leg resistance. The test may pass if the result is ≥90% and otherwise it may fail.

If there is a leakage imbalance and Tg and Rg<20 M and the ratio of the failure is 500:1 or higher, then RFL may be run to get the distance to fault (note: UFED in T/R strap for 60 seconds).

Some exemplary thresholds for these tests may include the following:

| Test | Pass | Fail |
| --- | --- | --- |
| Capacitivity Balance (%) | ≥97% | <85% |
| Capacitivity Balance (nF) | ≤3.0 nF | >7.5 nF |
| Longitudinal Balance | ≥60 dB | <60 dB |
| Longitudinal Balance (too high) | ≤98 dB | >98 dB |
| AC Voltage Balance | ≤0.5 Vac | >0.5 Vac |
| Resistance Leg Balance (%) | ≥98% | <90% |
| Resistance Leg Balance (Ω) | ≤2.0 Ω | >5.0 Ω |
| Leakage Resistive Balance | ≥90% | <90% |

Some reported results may be provided. For example, next to each measurement (e.g., Longitudinal Balance, AC Volts Balance, Resistive Leg Balance and Leakage Resistance Balance), an indicator of Pass/Fail/Marginal may be provided.

As with the other testing categories, expert advice may also be provided. For example, if cap balance fails, then expert advice may report "Possible one side open on (Tip/Ring/NB) at XX ft/m," where XX is the distance measured in the 2-terminal opens. If leakage resistance balance fails, then expert advice may report "Possible one side open on (Tip/Ring/A/B) at XX ft/m," where XX is the distance measured in the RFL distance to fault. The two failures above may stop the test and force the user to fix the problem. If any of these results are a failure, then the expert advice may be "Run Auto ID TDR" and the user may not continue testing.

Figure 7:
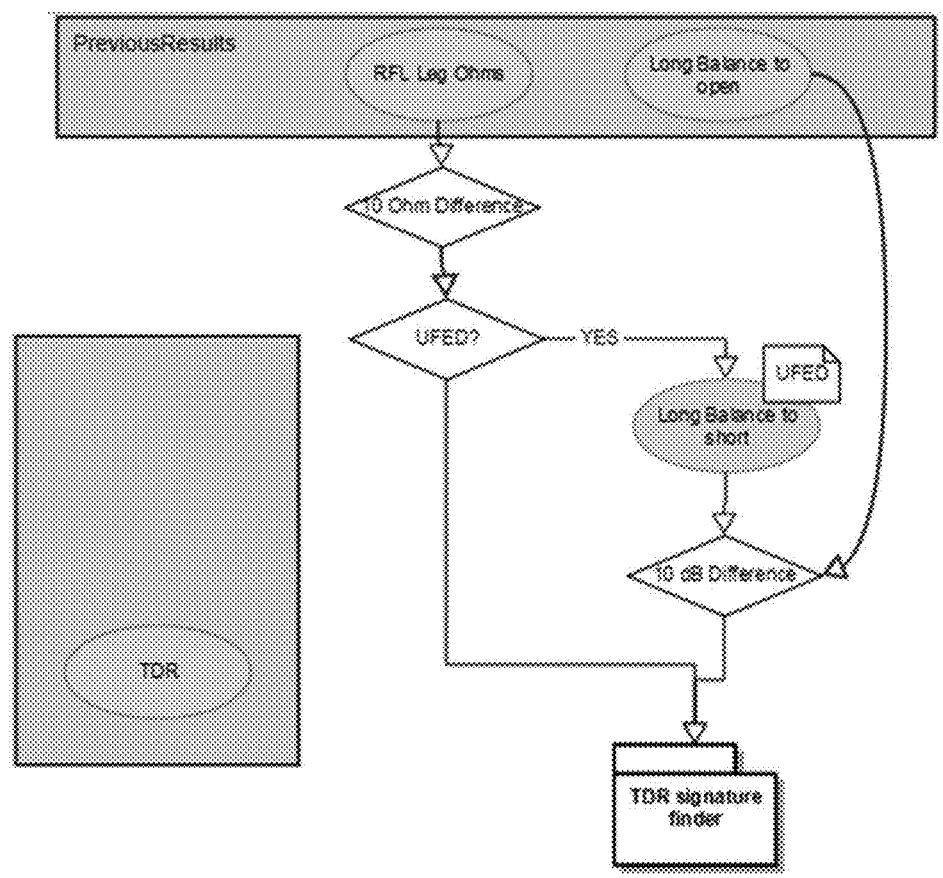
FIG. 7 illustrates a flow for series fault testing in a DSL network, according to an example.

FIG. 7 illustrates a flow 700 for series fault testing in a DSL network, according to an example. Measurements for series fault testing may include RFL Leg Resistance, Longitudinal Balance to Open, Longitudinal Balance to Short, or others. To measure RFL Leg Resistance, this test may be performed if there is a UFED and the state of the UFED is a strap to all. This result may likely be measured prior to the series fault section. It may also have the resistance for Tip and Ring.

For Longitudinal Balance to Open, the test may be provided if there is a UFED. If so, then this test may be performed in the open all state. This result may likely be measured prior to the series fault section. For Longitudinal Balance to Short, this test may be performed if there is a UFED and the state of the UFED is a strap to all. For TDR (splice detection), the TDR may be setup in AutoID mode. If there is a UFED, then this may be performed in the open all state. In some examples, there may also be a slice detection routine described in details below. In splice detection routine may use the TDR data to determine if there is a possible splice. The routine may start after the 50 ft and look for any result higher than 0.5. The routing may also look for any result lower than −0.5. If the up and down are within 12.0 ft, then the routine may indicate this as a possible splice.

There are a number of results that may be provided under the series fault testing category. For Series Fault by Longitudinal Balance, the Longitudinal Balance to Open minus the Longitudinal Balance to short may be calculated as a result. If this result is >10.0 then there may be a possible series fault. For Series Fault by RFL Leg Resistance, it may entail Calculating the absolute value of the difference between the leg resistances as a result. If the result is >10 ohms, then there may be a possible series fault. It should be appreciated that if there is no UFED, the only test with a result may be the TDR.

In summary, it should be appreciated that "leg balance may be bad" and may indicate a series fault. Such a result may be displayed whenever the RFL leg fails. "Series fault test may indicate a fault" may be displayed whenever the longitudinal balance series fault fails. "Splice found in TDR trace" may be displayed whenever TDR splice detection routine shows a splice. "Testing with a UFED would further help" may be displayed whenever the user tests without a UFED. "No Series Fault" may be is displayed whenever there are no failures (Leg balance, long balance difference and splice detection)

An example of expert advice for this testing may include "Run Auto ID TDR & confirm splice," which may be displayed whenever there is a series fault detected.

Figure 8:
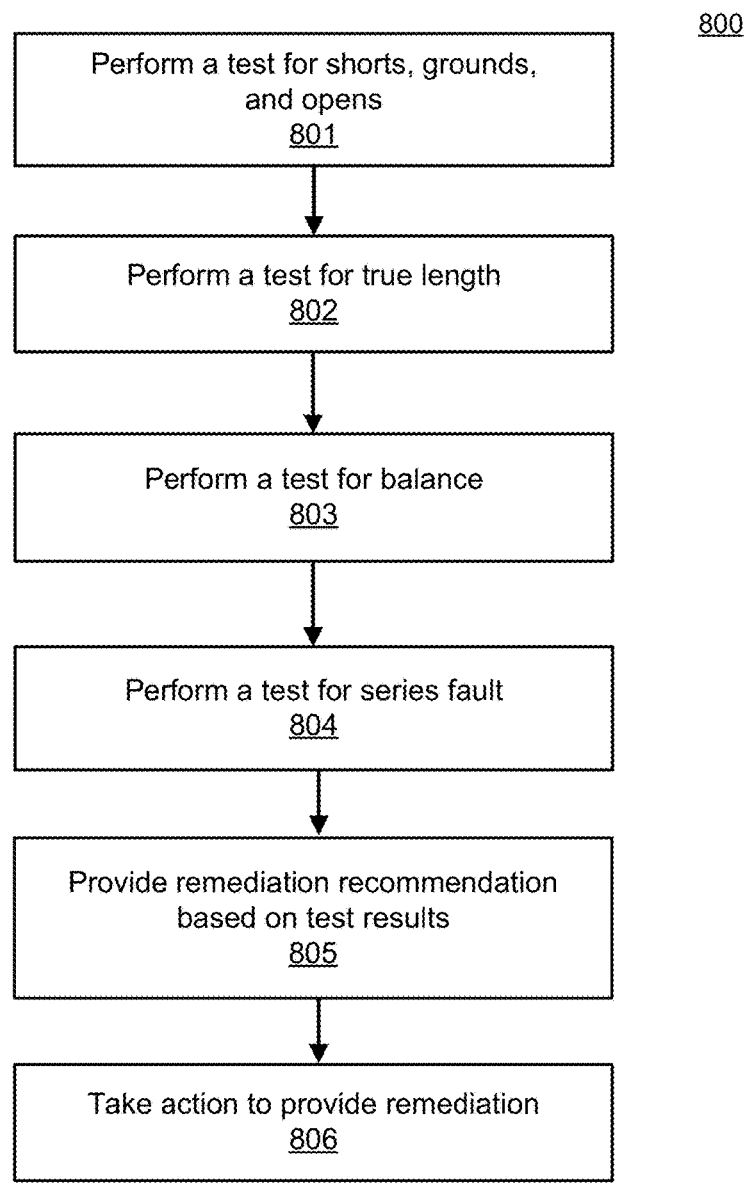
FIG. 8 illustrates a method for copper testing and remediation in a DSL network, according to an example.
Figure 9B:
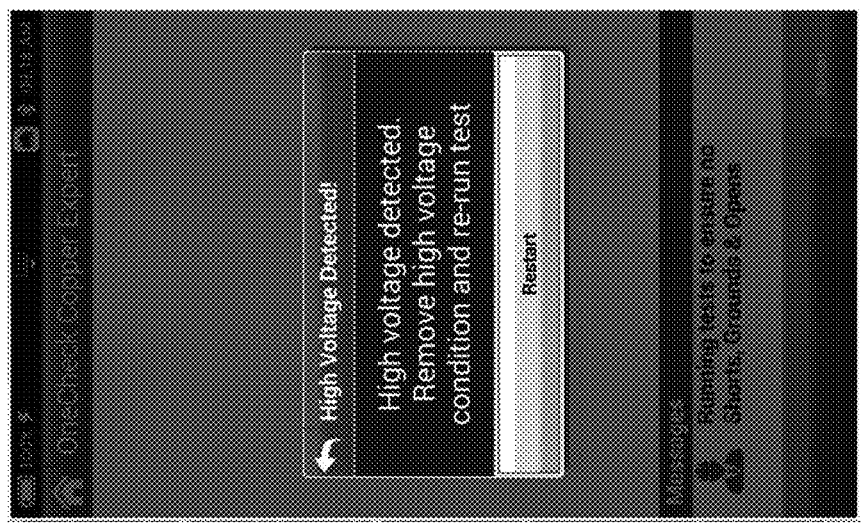
FIGS. 9A-9M illustrate screenshots that may be shown on a test instrument for copper testing and remediation in a DSL network, according to an example.
Figure 9A:
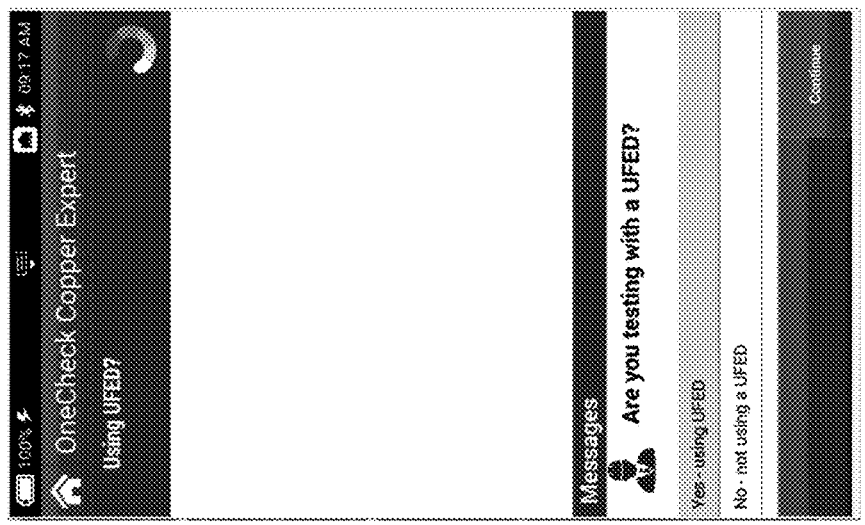
Figure 9D:
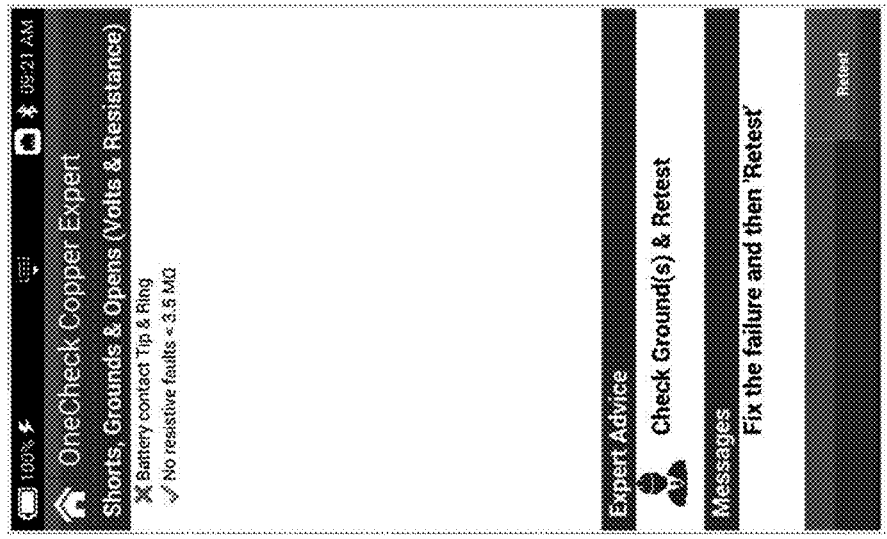
Figure 9C:
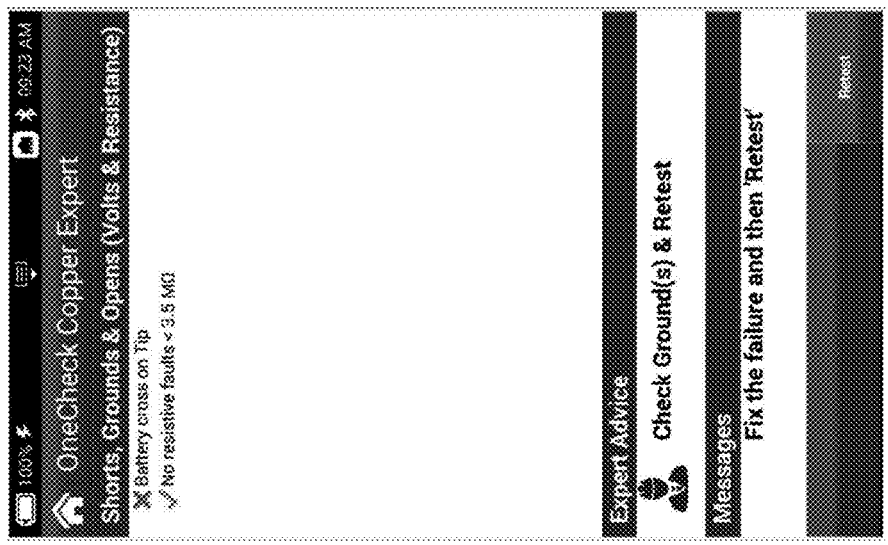
Figure 9F:
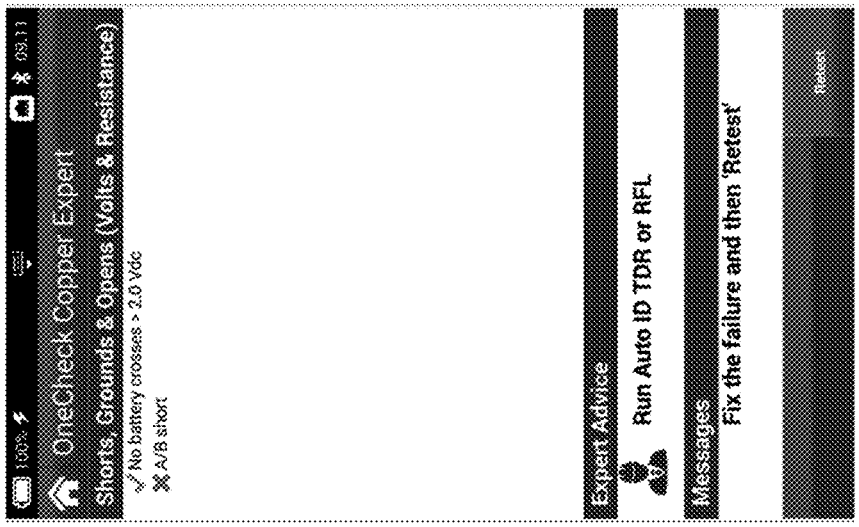
Figure 9E:
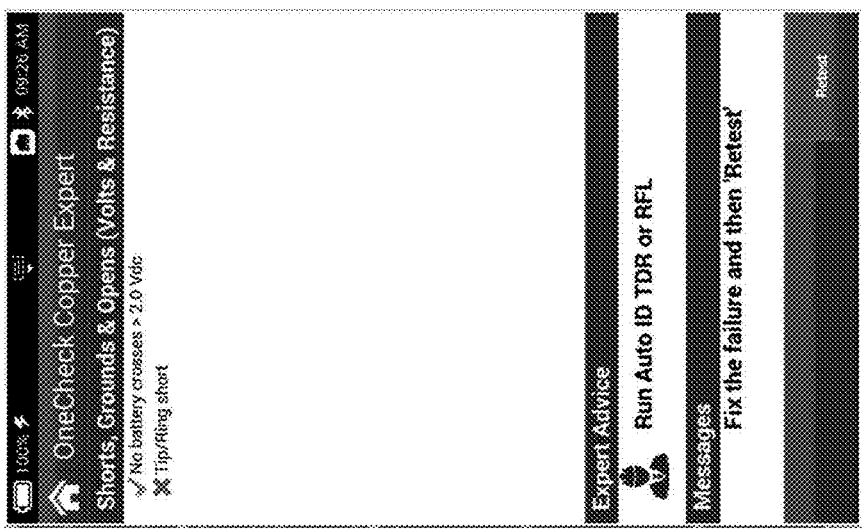
Figure 9H:
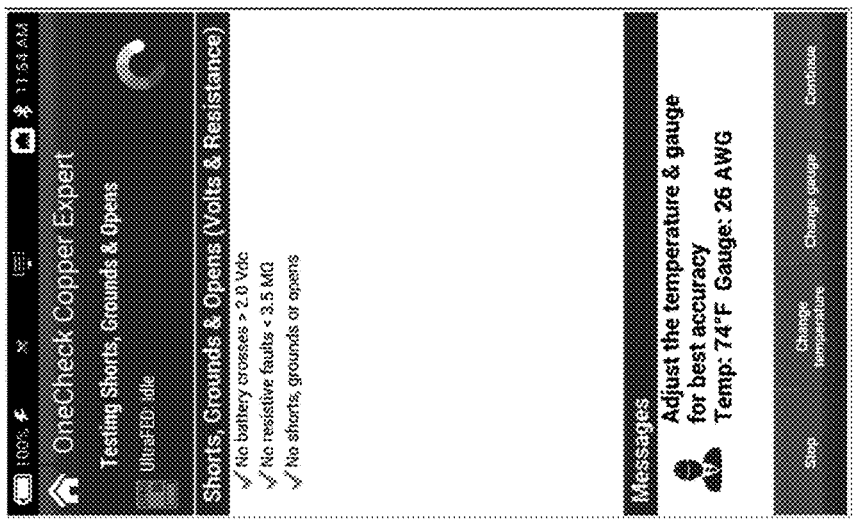
Figure 9G:
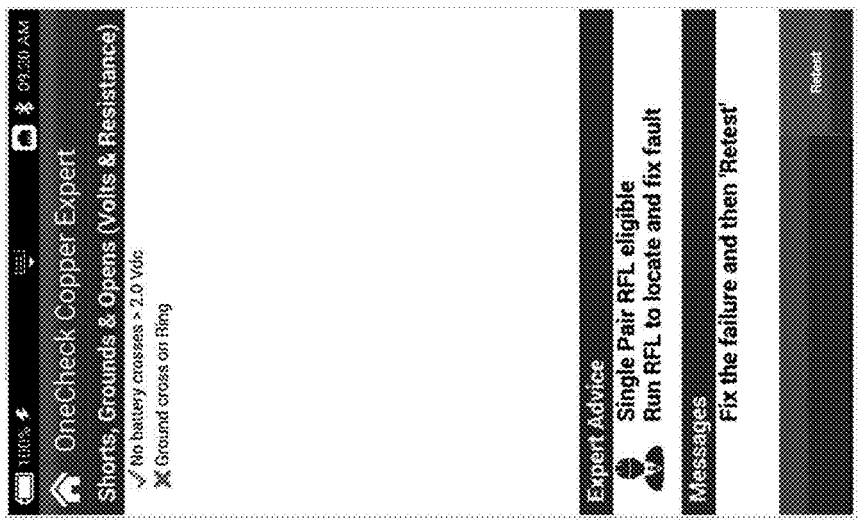
Figures 9I, 9J:
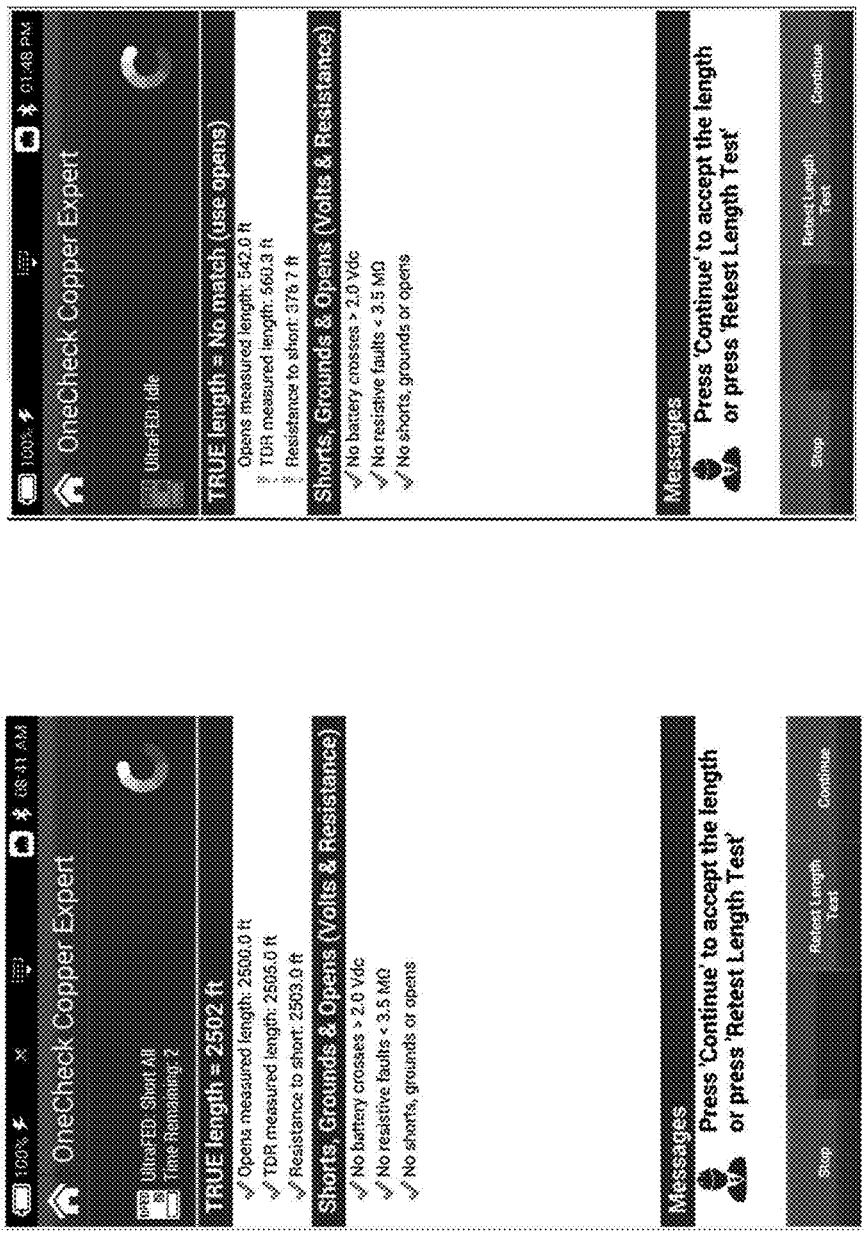
Figure 9L:
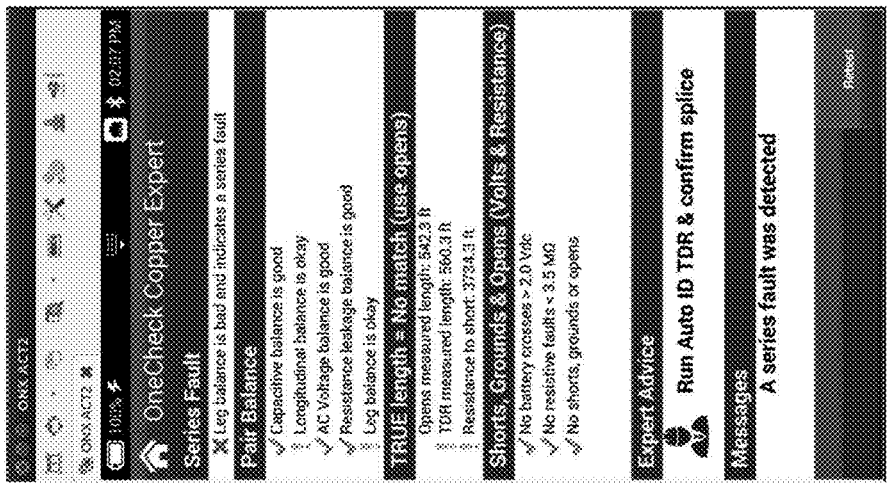
Figure 9K:
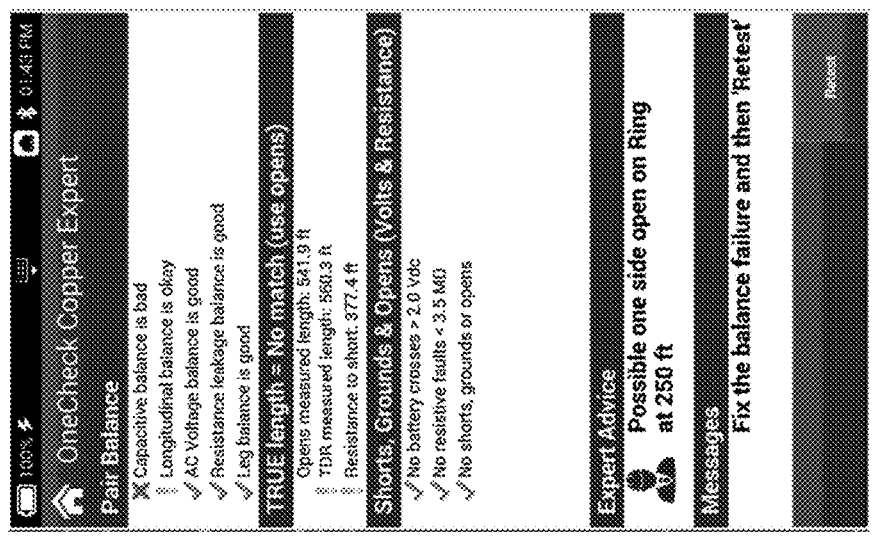
Figure 9M:
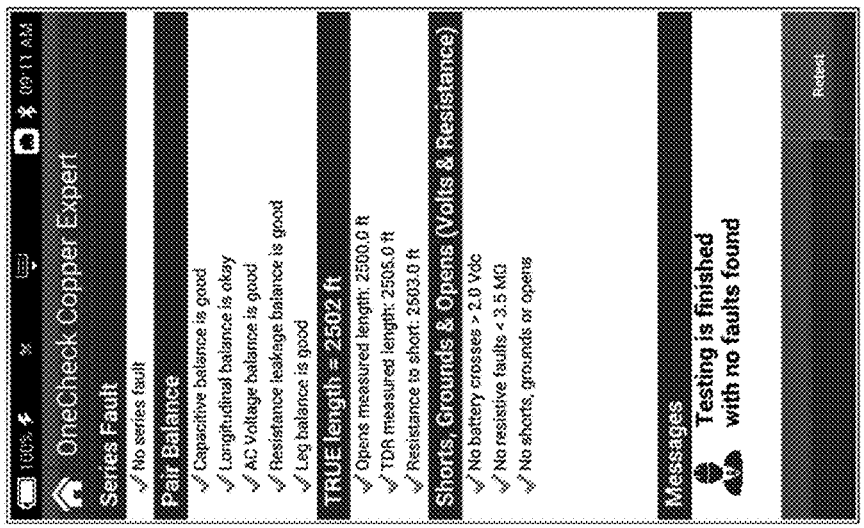

FIG. 8 illustrates a flow for a method 800 for copper testing and remediation in a DSL network, according to an example. The method 800 is provided by way of example, as there may be a variety of ways to carry out the method described herein. Although the method 800 is primarily described as being performed by system 100 as shown in FIG. 1 and/or test instrument 200 of FIG. 2, according to flows shown in FIGS. 3A-7, the method 800 may be executed or otherwise performed by other systems, or a combination of systems. The method 800 may also include information exchanged between the blocks shown in FIGS. 3A-7. Each block shown in FIG. 8 may further represent one or more processes, methods, or subroutines, and functionality discussed in connection with one or more of the blocks may be implemented using and/or may include machine-readable instructions stored on a non-transitory computer readable medium and executed by a processor or other type of processing circuit to perform one or more operations described herein.

The test instrument 200 may be connected to a network to provide copper impairment testing and remediation. In one example, the network may be a digital subscriber line (DSL) service network. In another example, the network may be a plain old telephone service (POTS) network. The processing circuit of the test instrument 200 may perform tests in a number of test categories. While only one test may determine coper impairment, it should be appreciated that in some examples, the processing circuit 250 may perform tests in at least two test categories to determine copper impairment. As described herein, the test categories may include tests for: (i) shorts, grounds, and opens, (ii) true length, (iii) balance, and (iv) series fault At block 801, the processing circuit may perform a test for shorts, grounds, and opens. These may include a voltage test, a copper pair validation test, a capacitance balance test, a resistance test, a battery fault test, a ground test, a leakage test, or a combination thereof. Other various tests for shorts, grounds, and opens may also be provided.

At block 802, the processing circuit may perform a test for true length. These may be based on opens, time domain reflectometry (TDR), resistance to strap, or a combination thereof. Other various tests for true length may also be provided.

At block 803, the processing circuit may perform a test for balance. These may include a capacitive balance test, a longitudinal balance test, a voltage balance test, a resistive leg balance test, a leakage resistance balance test, or a combination thereof. Other various tests for balance may also be provided.

At block 804, the processing circuit may perform a test for series fault. These may include measurements for resistive fault locate (RFL) leg resistance, longitudinal balance to open, longitudinal balance to short, or a combination thereof. Other various tests for series fault may also be provided.

Details of tests, functional parameters, measurements, and results for each test may be described in more detail above. It should be appreciated that the combination of these tests may help determine and confirm various a copper impairment issues.

At block 805, the processing circuit 250, via the display 213 or other interface, may provide remediation recommendations based at least in part on test results in at least one of the test categories. The output interface or display 213, for example, present the test results and/or remediation recommendations in a visual or graphical way. It should also be appreciated that test results and remediation recommendations may also be presented in other ways as well, such textually, aurally, or any other multimodal fashion. Test results and remediation recommendations may also be presented at a separate user device, such as a mobile device (e.g., SMS) or other communication channel.

At block 806, the processing circuit may coordinate with other network systems and components and further take action to remedy the copper impairment based on the remediation recommendation.

FIGS. 9A-9M illustrate screens that may be shown on a test instrument for copper testing and remediation in a DSL network, according to an example. Any number of these screenshots may be shown during any stage or category of testing described herein. These screens may provide testing results, measurement details, and/or expert advice based on one or more tests as described herein. It should be appreciated that these screens are exemplary. Other screens or variations may also be provided.

What has been described and illustrated herein are examples of the disclosure along with some variations. The terms, descriptions, and figures used herein are set forth by way of illustration only and are not meant as limitations.

Many variations are possible within the scope of the disclosure, which is intended to be defined by the following claims—and their equivalents—in which all terms are meant in their broadest reasonable sense unless otherwise indicated.

The invention claimed is:

1. A test instrument connectable to a network to provide copper impairment testing, the test instrument comprising:
   a port connectable to a test point in a network;
   a processing circuit to:
      perform tests in at least two of the following categories: (i) shorts, grounds, and opens, (ii) true length, (iii) balance, and (iv) series fault, wherein the combination of these tests may determine copper impairment used for prequalification;
      generate a remediation recommendation based at least in part on test results of at least one of the categories, wherein the remediation recommendation comprises a specific solution to fix the copper impairment; and
   an output interface to present results of copper impairment tests.

2. The test instrument of claim 1, wherein the network is a digital subscriber line (DSL) service network.

3. The test instrument of claim 1, wherein the network is a plain old telephone service (POTS) network.

4. The test instrument of claim 1, wherein the results of copper impairment tests are presented, by the output interface, in at least one of the following ways: visually, textually, graphically, aurally, and multimodally.

5. The test instrument of claim 1, wherein the test for (i) shorts, grounds, and opens comprises at least one of: a voltage test, a copper pair validation test, a capacitance balance test, a resistance test, a battery fault test, a ground test, and a leakage test.

6. The test instrument of claim 1, wherein the test for (ii) true length is based on at least one of opens, time domain reflectometry (TDR), and resistance to strap.

7. The test instrument of claim 1, wherein the test for (iii) balance comprises at least one of: a capacitive balance test, a longitudinal balance test, a voltage balance test, a resistive leg balance test, and a leakage resistance balance test.

8. The test instrument of claim 1, wherein the test for (iv) series fault comprises measurements for at least one of: resistive fault locate (RFL) leg resistance, longitudinal balance to open, and longitudinal balance to short.

9. The test instrument of claim 1, wherein:
   the output interface to present remediation recommendations in at least one of the following ways: visually, textually, graphically, aurally, and multimodally.

10. A method to provide copper impairment testing, comprising:
   connecting a test instrument to a test point in a network, wherein a processing circuit of the test instrument to:
      perform tests in at least two of the following categories: (i) shorts, grounds, and opens, (ii) true length, (iii) balance, and (iv) series fault, wherein the combination of these tests may determine copper impairment used for prequalification;
      generate a remediation recommendation based at least in part on test results of at least one of the categories, wherein the remediation recommendation comprises a specific solution to fix the copper impairment; and
   present results of copper impairment tests via an output interface of the test instrument.

11. The method of claim 10, wherein the network is a digital subscriber line (DSL) service network.

12. The method of claim 10, wherein the network is a plain old telephone service (POTS) network.

13. The method of claim 10, wherein the results of copper impairment tests are presented, by the output interface, in at least one of the following ways: visually, textually, graphically, aurally, and multimodally.

14. The method of claim 10, wherein the test for (i) shorts, grounds, and opens comprises at least one of: a voltage test, a copper pair validation test, a capacitance balance test, a resistance test, a battery fault test, a ground test, and a leakage test.

15. The method of claim 10, wherein the test for (ii) true length is based on at least one of opens, time domain reflectometry (TDR), and resistance to strap.

16. The method of claim 10, wherein the test for (iii) balance comprises at least one of: a capacitive balance test, a longitudinal balance test, a voltage balance test, a resistive leg balance test, and a leakage resistance balance test.

17. The method of claim 10, wherein the test for (iv) series fault comprises measurements for at least one of: resistive fault locate (RFL) leg resistance, longitudinal balance to open, and longitudinal balance to short.

18. The method of claim 10, further comprising:
   presenting, via the output interface, remediation recommendations in at least one of the following ways: visually, textually, graphically, aurally, and multimodally.

19. A non-transitory computer-readable storage medium having an executable stored thereon, which when executed instructs a processor to perform the method of claim 10.

20. A method to provide copper impairment testing and remediation in a digital subscriber line (DSL) service, comprising:
   performing, by a processing circuit of a test instrument, tests in at least two of the following categories: (i) shorts, grounds, and opens, (ii) true length, (iii) balance, and (iv) series fault, wherein the combination of these tests may determine copper impairment used for prequalification;
   generating at least one remediation recommendation based at least in part on test results in at least one of the categories, wherein the remediation recommendation comprises a specific solution to fix the copper impairment; and
   outputting test results of copper impairment tests and remediation recommendations to an output interface.

\* \* \* \* \*